United States Patent [19]

Hutchinson

[11] 3,980,960
[45] Sept. 14, 1976

[54] SIGNAL WIDTH AND WIDTH RATIO DETERMINING APPARATUS

[75] Inventor: Edward Hynes Hutchinson, Medford, Mass.

[73] Assignee: Computer Identics Corporation, Westwood, Mass.

[22] Filed: Oct. 9, 1975

[21] Appl. No.: 621,004

[52] U.S. Cl. .............................. 328/112; 307/229; 307/234; 328/127; 340/167 A
[51] Int. Cl.² ................................. H03K 5/20
[58] Field of Search ............ 307/229, 234; 328/111, 328/112, 127; 340/167 A

[56] References Cited
UNITED STATES PATENTS

| | | | |
|---|---|---|---|
| 3,179,882 | 4/1965 | Le Clear | 328/112 |
| 3,674,937 | 7/1972 | Bellanger et al. | 328/112 |
| 3,784,758 | 1/1974 | McIntosh et al. | 328/112 |
| 3,790,881 | 2/1974 | Smith | 328/112 |
| 3,800,234 | 3/1974 | Myren | 328/112 |

Primary Examiner—Stanley D. Miller, Jr.
Attorney, Agent, or Firm—Joseph S. Iandiorio

[57] ABSTRACT

Apparatus for determining whether the ratio of the widths of a pair of signals is within acceptable limits including integrator means, including a first integrator responsive to a first signal to integrate in a first direction at a first rate and to a second signal to integrate in the opposite direction at a second rate and a second integrator responsive to the first signal to integrate in the first direction at the second rate and to a second signal to integrate in the opposite direction at the first rate; indicator means responsive to the integrator means for providing a data signal representative of the first and second signals have the proper ratio beginning in response to the second integrator reaching a first predetermined level and ending in response to the first integrator reaching a second predetermined level and control means, responsive to the end of the second signal occurring during the presence of the data signal to provide a clock signal validating the data signal and to the end of the second signal occurring separately of the data signal to reject that data signal.

4 Claims, 7 Drawing Figures

SIGNAL WIDTH AND WIDTH RATIO DETERMINING APPARATUS

FIELD OF INVENTION

This invention relates to an apparatus for determining whether the ratio of the widths of a pair of signals is within acceptable limits and to an apparatus which also determines the relative widths of those signals.

BACKGROUND OF THE INVENTION

In conventional reading systems in which the width or other dimension of a coded mark is important the depth of field problem has been met in a number of ways. In one approach a specific mark is used as a reference against which the sizes of the other marks are compared. However, this requires relatively complex equipment to identify the reference mark and to carry out the comparison. Further, if the marks and reader are moved toward or away from each other after the reference mark is sensed error may result. In another approach, in which pairs of contrasting coded marks are viewed as a set, clock pulses increment a counter during the interval of one mark and then the counter is decremented by clock pulses during the interval of the contrasting mark. If the remainder in the counter is positive the first mark is bigger, if negative the second mark is bigger. With this technique when the decision is made that one of the marks is the larger and the other the smaller it is assumed that the two marks differ in size by the proper ratio but in fact the ratio may be any that satisfies the condition that the one is larger and the other smaller.

SUMMARY OF INVENTION

It is therefore an object of this invention to provide an improved, simple apparatus for determining whether the ratio of the widths of a pair of signals is within acceptable limits.

It is a further object of this invention to provide such an apparatus for determining the relative widths of those signals.

The invention features apparatus for determining whether the ratio of the widths of a pair of signals is within acceptable limits. There are integrator means including a first integrator responsive to the first signal to integrate in a first direction at a first rate and to a second signal to integrate in the opposite direction at a second rate, and a second integrator responsive to the first signal to integrate in the first direction at the second rate and to the second signal to integrate in the opposite direction at the first rate. There are indicator means responsive to the integrator means for providing a data signal representative of the first and second signals having the proper ratio beginning in response to the second integrator reaching a first predetermined level and ending in response to the first integrator reaching a second predetermined level. Control means respond to the end of the second signal occurring during the presence of the data signal to provide a clock signal validating the data signal, and respond to the end of the second signal occurring separately of the data signal to reject the data signal. In a preferred embodiment in which one of the signals occurs in a first width and a second width and the other occurs in only one of those widths, the relative widths of that pair of signals as well as the ratio of the widths of that pair of signals is determined using third and fourth integrators operated to begin integrating at the end of the first signal at a level which relates to the level in the first and second integrators, respectively, in similar proportion as the second width relates to the first width.

In specific embodiments, the integrators include counters and the integrating means includes a pulse source for supplying pulses at a first rate and at a second rate and gating means for directing pulses from the pulse source to selective ones of the integrators or counters in response to the first and second signals.

DISCLOSURE OR PREFERRED EMBODIMENT

Other objects, features and advantages will occur from the following description of a preferred embodiment and the accompanying drawings, in which.

Figure 1:
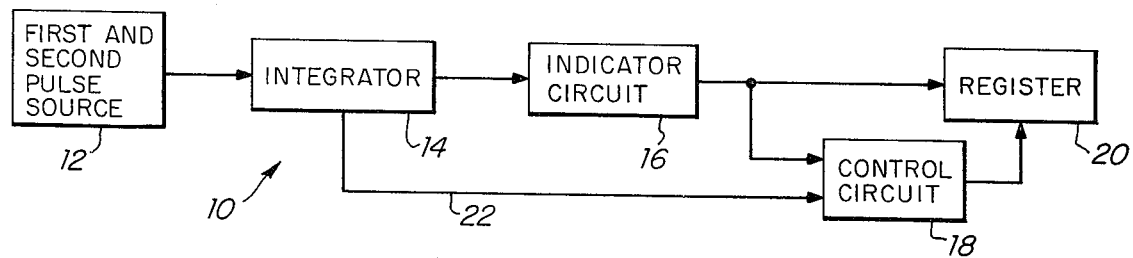
FIG. 1 is a simplified block diagram illustrating the apparatus of this invention.

There is shown in FIG. 1 an apparatus 10 for determining whether the ratio of the widths of a pair of signals is within acceptable limits. The pair of signals including first and second signals may be provided by any suitable source 12 of first and second signals. Apparatus 10 includes integrator 14, indicator circuit 16, control ciruit 18 and register 20.

Integrator 14 performs two separate integrations in response to the first and second signals from source 12. In the first integration integrator 14 integrates in a first direction at a first rate in response to the first signal and in the opposite direction at a second rate in response to the second signal whereas in the second integration, integrator 14 integrates in the first direction during the first signal at a second rate and integrates in the opposite direction during the second signal at the first rate. Because of the difference in the integrating rates performed in the two integrations, one of the integrations reaches a predetermined level, such as zero, before the other integration operation does. The first to reach some predetermined level triggers indicator 16 to provide a data signal representative that the first and second signals are in the proper ratio while the second integration operation to reach a predetermined level triggers indicator 16 to stop that representation of the data signal. This data signal is applied to register 20 and also to control circuit 18. If during the period of that data signal a signal has ended, control circuit 18 provides a signal to register 20 to enable it to accept the data signal from indicator circuit 16. If the signal on line 22, FIG. 2, does not occur during the presence of the data signal, that is if it occurs separately, either before or after the presence of the data signal, then a signal is provided by control circuit 18 to register 20 to reject the data signal from indicator circuit 16.

Figure 2:
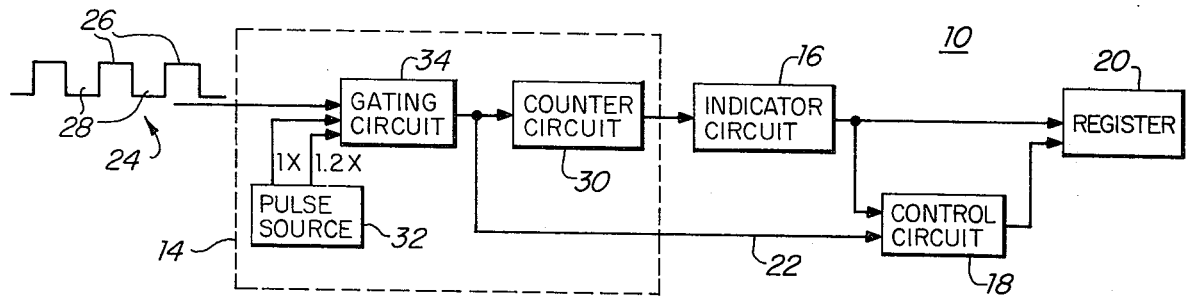
FIg. 2 is a more detailed block diagram showing the apparatus of this invention adapted for determining whether the ratio of the widths of a pair of signals is within acceptable limits.

More specifically, the input signal 24 may appear as in FIG. 2 in which the first signals 26 are positive portions and the second signals 28 are negative portions. Integrator 14 may include counter circuit 30, pulse source 32 providing pulses at two different pulse rates, 1.2X and 1X, and gating circuit 34 for controlling the pulses delivered to counter circuit 30 in response to input signal 24.

Figure 3:
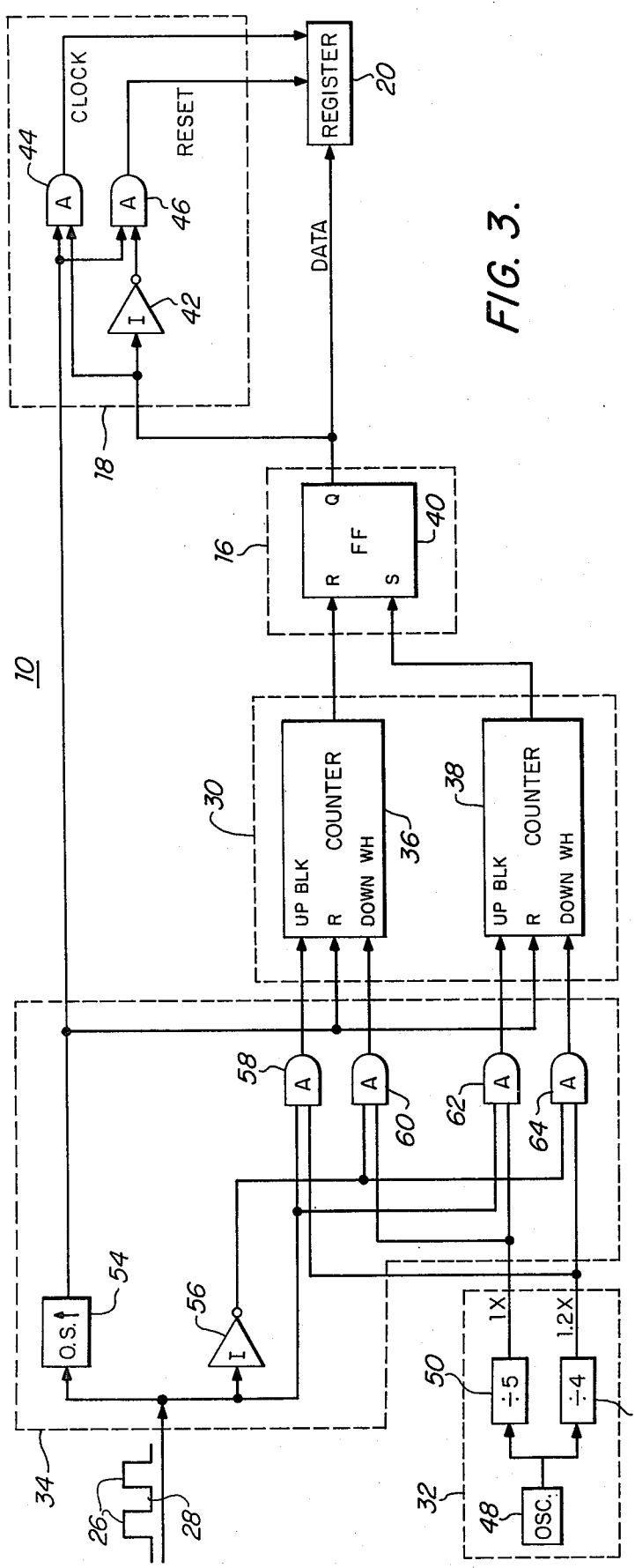
FIG. 3 is a more detailed schematic diagram of the apparatus shown in FIG. 2.

More specifically, as shown in FIG. 3, counter circuit 30 includes two counters 36 and 38, and indicator circuit 16 includes a flip-flop 40. Control circuit 18 includes inverter 42 and AND gates 44 and 46. Pulse source 32 includes oscillator 48 whose fixed frequency output is divided by five in divider 50 to provide a 1X output and divided by four in divider 52 to provide a 1.2X output to gating circuit 34, which includes one-shot 54, inverter 56, and AND gates 58, 60, 62 and 64.

In operation the first signal 26 operates one-shot 54 and enables AND gate 58 to pass clock pulses at the rate of 1.2X to the count-up input of counter 36 and enables AND gate 62 to pass pulses at the pulse rate of 1X to the count-up input of counter 38. Subsequently, second signal 28 through inverter 56 disables one-shot 54 and enables AND gate 60 to deliver pulses at the rate of 1X to the count-down input of counter 36 and enables AND gate 64 to provide pulses at the rate of 1.2X to the count-down input of counter 38.

Figure 4:
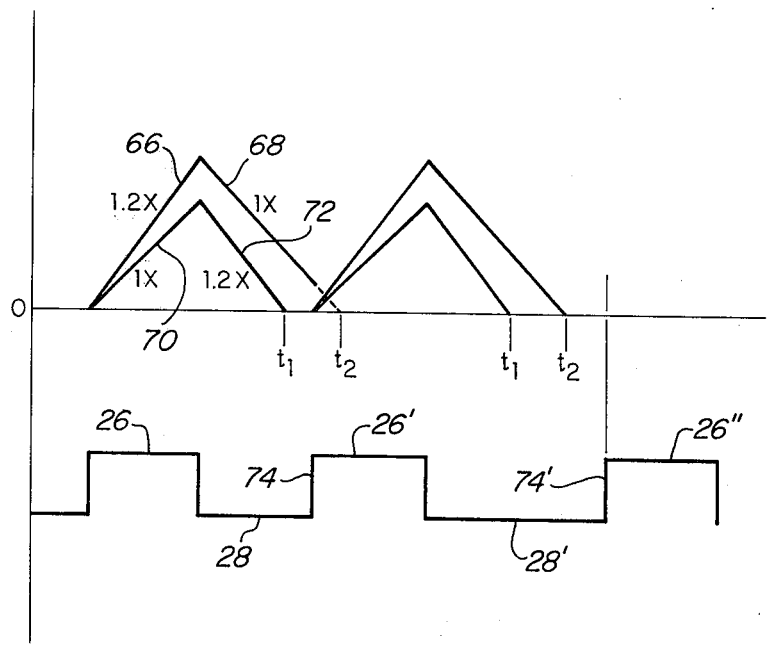
FIG. 4 is a chart illustrating the input signals and integrator action of the apparatus in FIG. 3.

Thus as shown in FIG. 4, during a first signal 26 counter 36 counts up 66 at a rate of 1.2X and down 68 at the rate of 1X, while counter 38 counts up 70 at the rate of 1X and down 72 at the rate of 1.2X. Thus counter 38 typically reaches a predetermined level such as zero in FIG. 4 at time $t_1$ while counter 36 reaches that level at later time $t_2$. As a result flip-flop 40 is set at time $t_1$ by counter 38 and remains set until reset at time $t_2$ by the output of counter 36. During this period the data signal output to register 20 is also supplied to AND gate 44 and through inverter 42 to AND gate 46. If the end 74, FIG. 4, of second signal 28 occurs during the time $t_1 - t_2$ when AND gate 44 is enabled and AND gate 46 is disabled, the signal from one-shot 54 indicating that second signal 28 has ended generates an output from AND gate 44 which acts as a clock signal to cause register 20 to accept the data from flip-flop 40. If, however, as shown with the second set of signals 26' and 28' in FIG. 4, the end 74' of the second signal 28' occurs after time $t_2$ when the low signal being supplied to inverter 42 and AND gate 44 disables AND gate 44 but enables AND gate 46, then upon the occurrence of a late (or early) end of the second signal 28' a reset signal is provided to register 20 which rejects the data from flip-flop 40. Thus the time $t_1 - t_2$ establishes an acceptance range in dependence upon the pulse rates e.g. ratios of 1X and 1.3X define a greater acceptance range than ratio of 1x and 1.2X while the ratio of 1X and 1.2X define a greater range than 0.9X and 1X.

Figure 5:
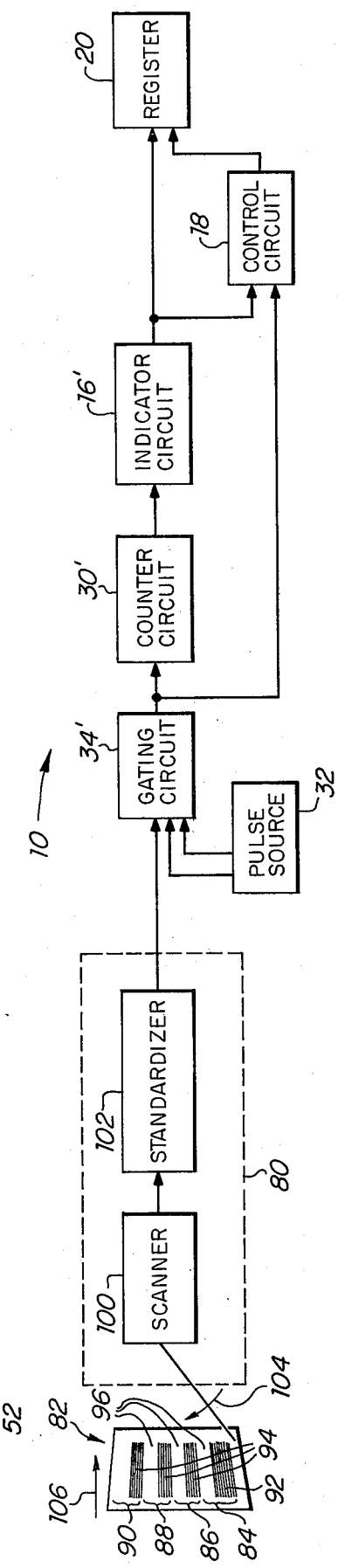
FIG. 5 is a detailed block diagram of a preferred embodiment of the invention which determines the relative widths of a pair of first and second signals as well as the ratio of those widths.

In a preferred embodiment the first and second signal source 12 of FIG. 1, may include a sensor 80, FIG. 5, which may be any type of sensing means compatible with the form of information to be sensed. In FIG. 5, like parts have been given like numbers and similar parts like numbers primed with respect to FIGS. 2 and 3. For example, if the information were magnetic markings, sensor 80 would include a magnetic reading head; and if the information to be read were in the form of optical indicia then the sensor 80 would include an optical reading head. In the example of FIG. 5, information to be read is in the form of a label 82 composed of one or more cells 84, 86, 88 and 90, each of which is composed of either a wide 92, or a narrow 94, black space and a narrow white space 96. In an optical system the contrast may be achieved by providing each of the spaces or segments in the cell with optically distinguishable characteristics e.g. for a system which has two marks per cell the marks may be black or white, retroreflective or nonretroreflective. In a system in which there are two or more marks per cell, a number of different colors or reflective qualities could be used, for example, sensitivity to infrared, ultraviolet or other radiation may be used. Typically, with sensor 80 including a scanner 100 and standardizer 102, label 82 may be a simple label using black segments and white segments which are scanned in the direction of arrow 104 by scanner 100 as label 82 moves past it in the direction of arrow 106.

Figure 6:
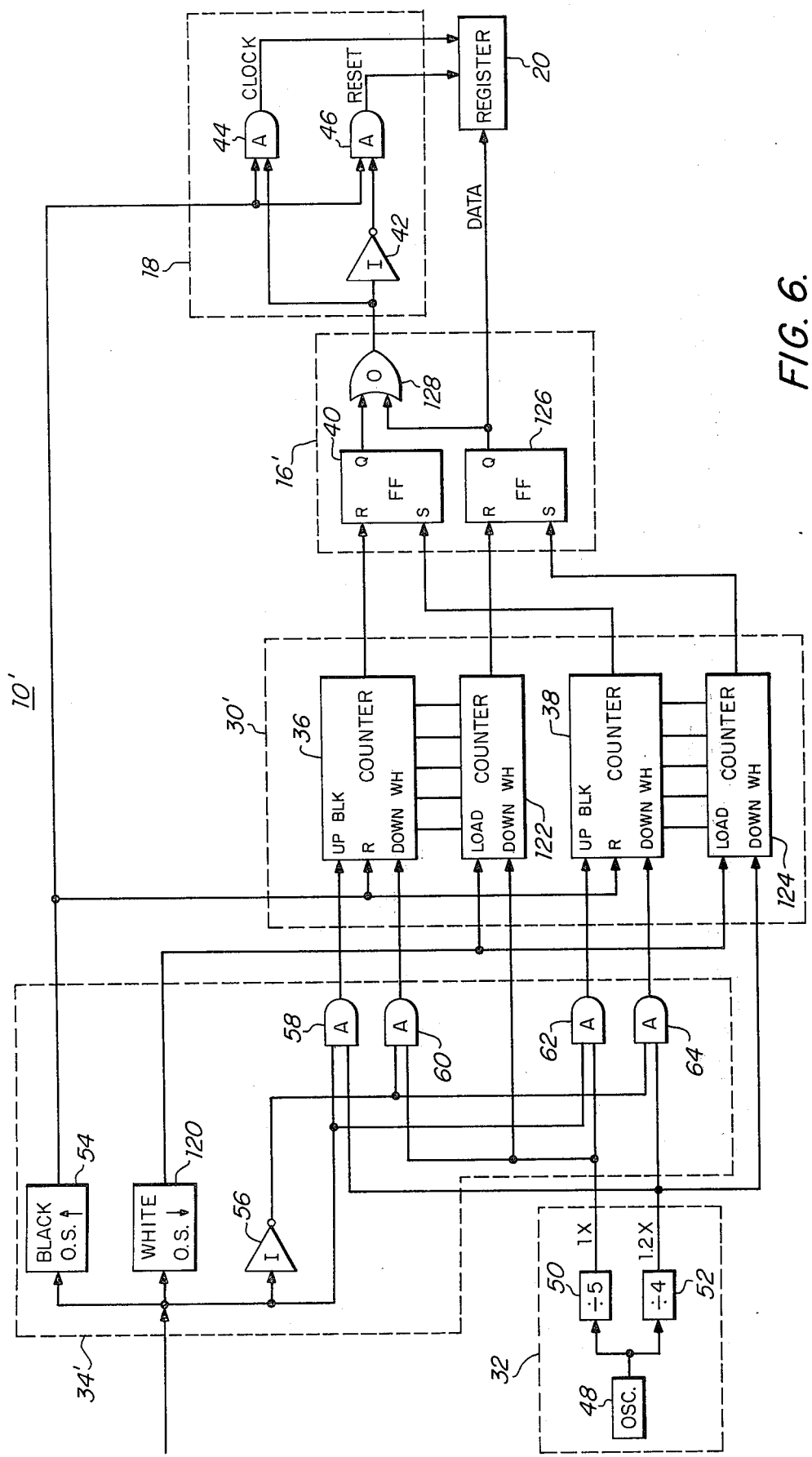
FIG. 6 is a more detailed schematic diagram of the apparatus of FIG. 5.
Figure 7:
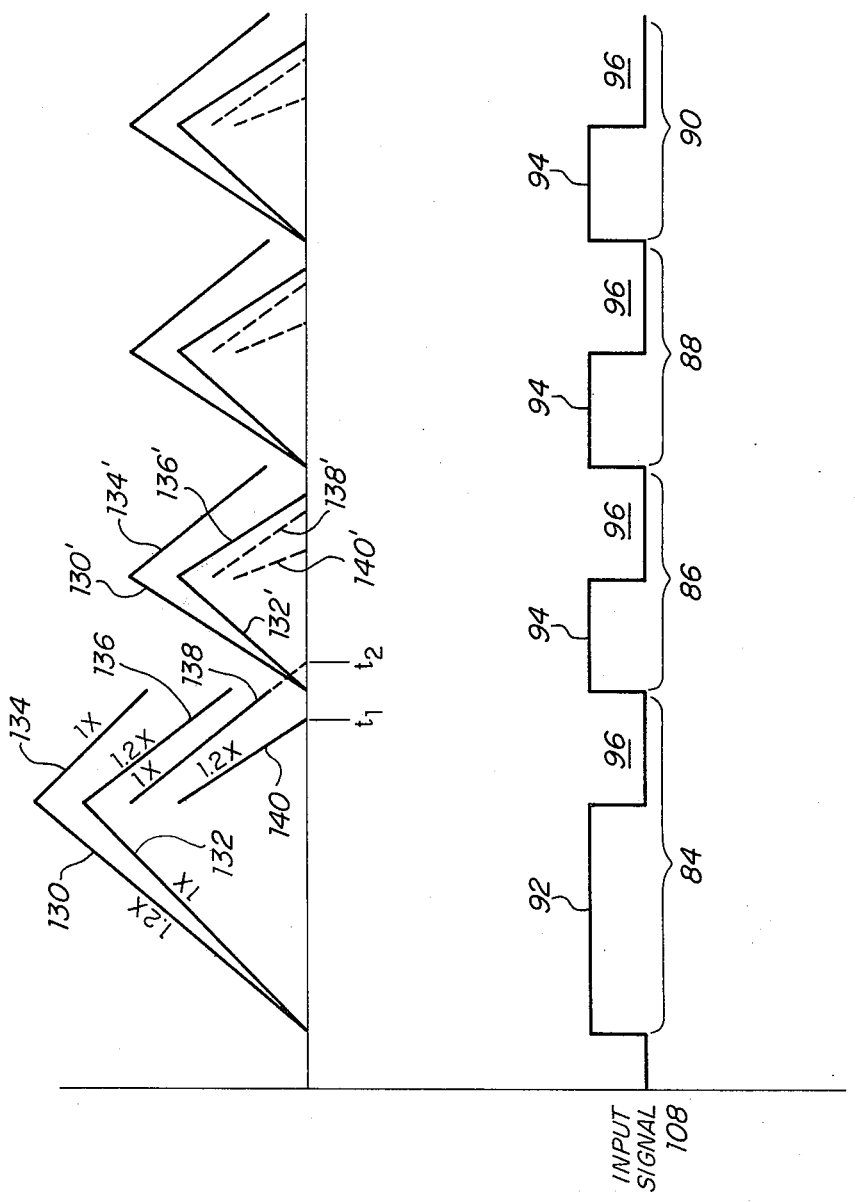
FIG. 7 is a chart illustrating the input signals and integrating action of the apparatus in FIG. 6.

Whatever the input, the output from scanner 100 is standardized as to amplitude and shape in standardizer 102 which provides input signal 108, FIG. 7, to apparatus 10', FIG. 6, in which like parts have been given like numbers and similar parts like numbers primed with respect to FIGS. 2 and 3. In FIG. 6, in contrast to FIG. 3, one-shot 54 is specifically designated as a black one-shot and a second white one-shot 120 is added. In addition counters 122 and 124 have been added to the counter circuit 30', and a second flip-flop 126 and OR gate 128 have been added to indicator circuit 16'. Counters 122 and 124 are loaded upon a signal from white one-shot 120 which also triggers counter 122 to count down at the rate of 1X and counter 124 to count down at the rate of 1.2X. Each of counters 122 and 124 is loaded with a count which relates to the count in its associated counter 36, 38, respectively, similar to the way that the sizes of the signals being processed relate to each other. Thus, as shown in FIG. 7, where the wide, black first signal 92 in cell 84 is twice the width of the second white signal 96, counters 122 and 124 will be loaded with ½ the count contained in counters 36 and 38 when the load signal is received. Flip-flop 126 in indicator 16' is set when counter 124 reaches a predetermined level such as zero and provides a data output to register 20 and OR gate 128 until a second reset signal is received from counter 122 having reached a predetermined level.

In operation, upon receipt of a wide black first signal 92, FIG. 7, AND gates 58 and 62 are enabled and counters 36 and 38 begin to count up 130, 132, FIG. 7, at the rate of 1.2X and 1X, respectively. At the end of the wide black signal 92 and the beginning of the narrow white signal 96 in cell 84, FIG. 7, counter 36 begins to count down 134 at the rate of 1X while counter 38 begins to count down 136 at the rate of 1.2X; as can be seen neither of the counters reaches a preselected level e.g. zero before the end of white signal 96 occurs. However, simultaneously with the beginning of the countdown operation of counters 36 and 38, a load signal from white one-shot 120 at the beginning of white signal 96 loads counters 122 and 124 with half the high level count and begins then counting down; counter 122 counts down 138 at the rate of 1X while counter 124 counts down 140 at the rate of 1.2X. Thus counter 124 reaches a predetermined level which sets flip-flop 126. While flip-flop is thus set the data signal is provided to the input of register 20 and through OR gate 128 to AND gate 44 and through inverter 42 to AND gate 46. Before counter 122 reaches the predetermined level and resets flip-flop 126 the end of the white segment signal 96 occurs, as signified by the beginning of the next narrow black signal 94 in cell 86 resulting in a signal from black one-shot 54. Since AND gate 44 is now enabled by the signal from one-shot 54, AND gate 44 provides a clock pulse to register 20 to enable it to accept the data level from flip-flop 126. This data level provided by flip-flop 126 conjunctively with the clock pulse from AND gate 44 is recognized as a binary one representing that the black signal 92 was determined to be a wide black signal and was approximately twice as big as the following white signal 96 within acceptable limits i.e. time $t_1 - t_2$. The next set of signals, the black signal 94 and the white signal 96 in cell 86 are approximately the same width; they are both narrow. Thus counters 36 and 38 count up 130', 132' and down 134', 136' as previously with respect to cell 84. Counter 38 reaches the predetermined zero level, sets flip-flop 40 and provides a data signal through OR gate 128 to the control circuit 18 and maintains that data signal until counter 36 reaches a predetermined level and provides a reset to flip-flop 40. However, before that reset signal occurs the end of the narrow white signal 96 in cell 86 occurs causing enabled AND gate 44 to provide a clock pulse at register 20 to clock in the data signal from flip-flop 126. Flip-flop 126 had been earlier set and reset when counters 124 and 122 counting down 140', 138', FIG. 7, each reached the predetermined zero level. However, during the period between the time that the set and reset signals were applied to flip-flop 126, white signal 96 did not end so there was no conjunctive signal to operate either AND gate 44 or AND gate 46 so the data indicating a one, then present at the output of flip-flop 126, was neither clocked in nor rejected but simply ignored. Finally, following that, the output of flip-flop 126 went low indicating a zero or narrow black. Thus, subsequently, when flip-flop 40 enabled AND gate 44 after counter 38 reached a predetermined level and the signal from black one-shot 54 arrived at AND gate 44, a clock signal was provided to register 20 to enter the low data signal into register 20 thereby correctly indicating that the black signal 94 in cell 86 was a narrow black signal representing a binary zero. A reset of register 20 occurs if the black leading edge occurs outside the two acceptable timing zones.

Other embodiments will occur to those skilled in the art and are within the following claims.

What is claimed is:

1. Apparatus for determining whether the ratio of the widths of a pair of signals is within acceptable limits comprising:
   integrator means, including a first integrator responsive to a first signal to integrate in a first direction at a first rate and to a second signal to integrate in the opposite direction at a second rate and a second integrator responsible to a first signal to integrate in said first direction at said second rate and to a second signal to integrate in the opposite direction at said first rate;
   indicator means, responsible to said integrator means, for providing a data signal representative of the first and second signals having the proper ratio beginning in response to said second integrator reaching a first predetermined level and ending in response to said first integrator reaching a second predetermined level; and
   control means responsive to the end of said second signal, occurring during the presence of said data signal to provide a clock signal validating said data signal and to the end of said second signal occurring separately of said data signal to reject said data signal.

2. The apparatus of claim 1 in which said first and second integrators include first and second counters, respectively, and said integrator means further includes a pulse source for supplying pulses at a first pulse rate and a second pulse rate, and gating means for delivering said pulses at said first pulse rate to said first counter in response to said first signal and at said second pulse rate in response to a said second signal, and for delivering said pulses at said second pulse rate to said second counter in response to a said first signal and at said first pulse rate in response to a said second signal.

3. Apparatus for determining the relative widths of a pair of first and second signals and whether the ratio of the widths of that pair of signals is within acceptable limits, wherein one of said signals occurs in a first width and a second width and the other occurs in one of those widths, comprising:
   integrator means including a first integrator responsive to a said first signal to integrate in a first direction at a first rate to a first level and to a said second signal to integrate in the opposite direction at a second rate to a second level and a second integrator responsive to a said first signal to integrate in said first direction at said second rate to a third level and to a said second signal to integrate in the opposite direction at said first rate to a fourth level and including a third integrator, responsive to the end of a said first signal, to integrate in said opposite direction at said second rate beginning at a fifth level which relates to the first level of said first integrator in similar proportion as said second width relates to said first width and ending at a sixth level, and a fourth integrator, responsive to the end of a said first signal to integrate in said opposite direction at said first rate beginning at a seventh level which relates to said third level of said second integrator in similar proportion as said second width relates to said first width and ending at an eighth level;
   indicating means including a first indicator circuit responsive to said first and second integrators, for providing a first data signal, representative of said first and second signals having the same width, beginning in response to said second integrator reaching said fourth level and ending in response to said first integrator reaching said second level, and a second indicator circuit responsive to said third and fourth integrators for providing a second data signal representative of said first and second signals having different widths beginning in response to said fourth integrator reaching said eighth predetermined level and ending in response to said third integrator reaching said seventh predetermined level; and
   control means, responsive to the end of said second signal occurring during the presence of either said first data signal or said second data signal to provide a clock signal validating said data signals and to the end of said second signal occurring separately of said data signals to reject said data signals.

4. The apparatus of claim 3 in which each of said first, second, third and fourth integrators includes, respectively, a first, second, third and fourth counter circuit and said integrating means further includes a pulse source for supplying pulses at a first pulse rate and a second pulse rate, and gating means for delivering said pulses at said first pulse rate to said first counter in response to a said first signal and at said second pulse rate in response to said second signal, and for delivering said pulses at said second pulse rate to said second counter in response to a said first signal and at said first pulse rate in response to said second signal, said pulse source providing pulses at said first pulse rate to said fourth counter and at said second pulse rate to said third counter and said gating means further providing a load signal to load at the end of a said first signal each of said third and fourth counters with counts which are proportional to the counts then in said first and second counters, respectively.

* * * * *